US009337135B2

(12) United States Patent
Lii et al.

(10) Patent No.: US 9,337,135 B2
(45) Date of Patent: May 10, 2016

(54) POP JOINT THROUGH INTERPOSER

(71) Applicant: Taiwan Semiconductor Manufacturing Company, Ltd., Hsin-Chu (TW)

(72) Inventors: Mirng-Ji Lii, Sinpu Township (TW); Chien-Hsun Lee, Chu-tung Town (TW); Yu-Min Liang, Zhongli (TW); Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/509,815

(22) Filed: Oct. 8, 2014

(65) Prior Publication Data

US 2016/0104668 A1   Apr. 14, 2016

(51) Int. Cl.

| H01L 23/02 | (2006.01) |
|---|---|
| H01L 25/00 | (2006.01) |
| H01L 25/10 | (2006.01) |
| H01L 23/498 | (2006.01) |
| H01L 25/065 | (2006.01) |
| H01L 23/00 | (2006.01) |

(52) U.S. Cl.
CPC .... *H01L 23/49833* (2013.01); *H01L 23/49827* (2013.01); *H01L 23/49838* (2013.01); *H01L 24/81* (2013.01); *H01L 25/0657* (2013.01); *H01L 25/50* (2013.01); *H01L 2224/81815* (2013.01); *H01L 2225/06517* (2013.01); *H01L 2225/06548* (2013.01); *H01L 2225/06572* (2013.01); *H01L 2924/14* (2013.01)

(58) Field of Classification Search
CPC ............... H01L 23/49833; H01L 23/49838; H01L 23/49827; H01L 25/50; H01L 25/0657; H01L 24/81; H01L 2225/06517; H01L 2224/06548; H01L 2225/06572; H01L 2224/81815; H01L 2924/14

USPC ......... 257/686, 621, 667, 779, 737, 738, 778, 257/773, 774; 438/109
See application file for complete search history.

(56) References Cited

U.S. PATENT DOCUMENTS

| 8,658,464 | B2 | 2/2014 | Cheng et al. | |
|---|---|---|---|---|
| 8,779,606 | B2 | 7/2014 | Yim et al. | |
| 9,111,930 | B2* | 8/2015 | Wu | H01L 25/50 |
| 2003/0139071 | A1* | 7/2003 | Li | H01L 23/367 439/66 |
| 2005/0127489 | A1* | 6/2005 | Mallik | H01L 23/04 257/686 |
| 2008/0258285 | A1* | 10/2008 | Harper | H01L 23/3128 257/686 |
| 2010/0304530 | A1 | 12/2010 | Yim et al. | |
| 2011/0241218 | A1 | 10/2011 | Meyer et al. | |
| 2012/0280404 | A1 | 11/2012 | Kwon et al. | |
| 2014/0217575 | A1* | 8/2014 | Hung | H01L 21/50 257/713 |
| 2014/0240187 | A1* | 8/2014 | Herbsommer | H01P 3/16 343/785 |
| 2014/0264811 | A1* | 9/2014 | Wu | H01L 25/50 257/686 |
| 2014/0264857 | A1* | 9/2014 | Wu | H01L 21/6835 257/738 |
| 2015/0137338 | A1* | 5/2015 | Lin | H01L 23/49816 257/676 |

* cited by examiner

*Primary Examiner* — Alexander Oscar Williams
(74) *Attorney, Agent, or Firm* — Slater Matsil, LLP

(57) ABSTRACT

A package includes a package component and an interposer over and bonded to the package component. The package component includes a solder region. The interposer includes a core dielectric material, a conductive pipe penetrating through the core dielectric material, with the first solder region in contact with a bottom end of the conductive pipe, and a through-opening in a center region of the interposer.

20 Claims, 8 Drawing Sheets

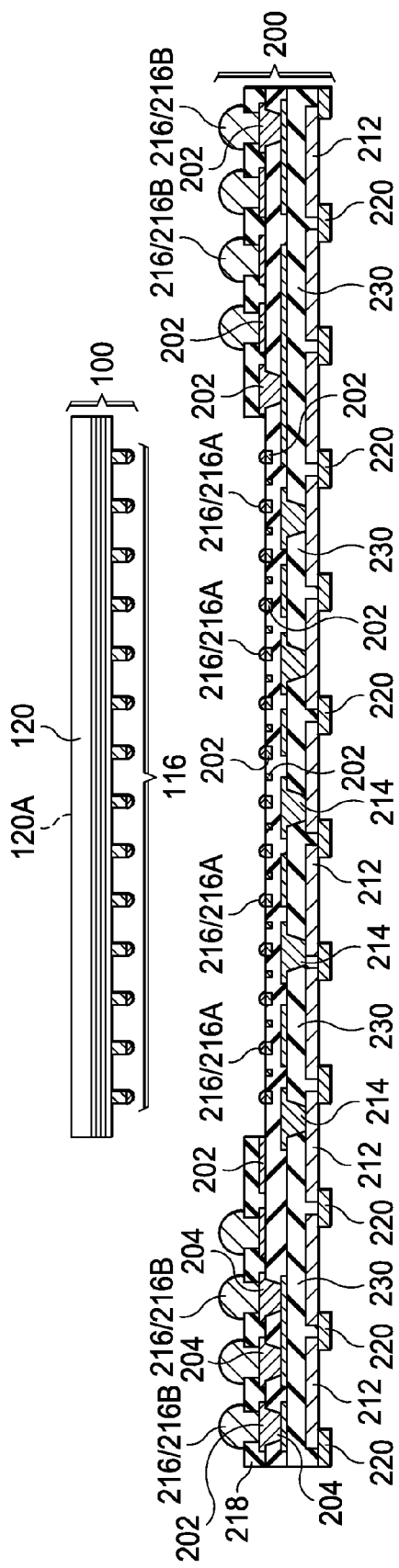
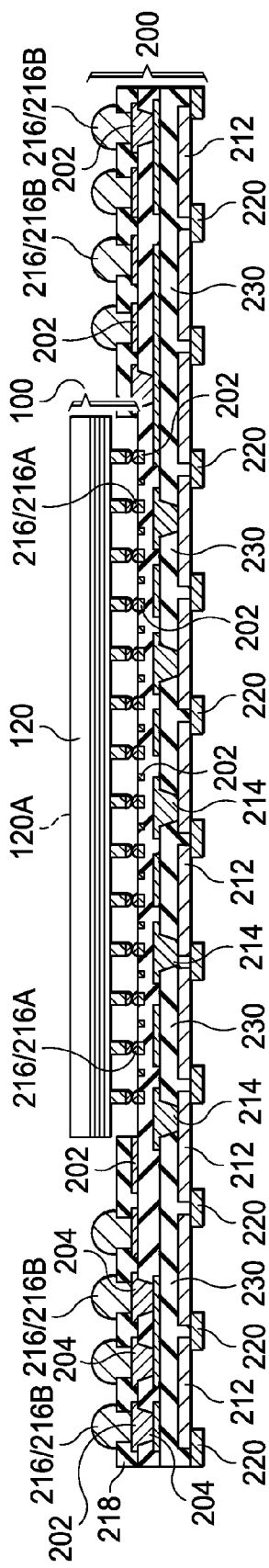
FIG. 1
FIG. 2

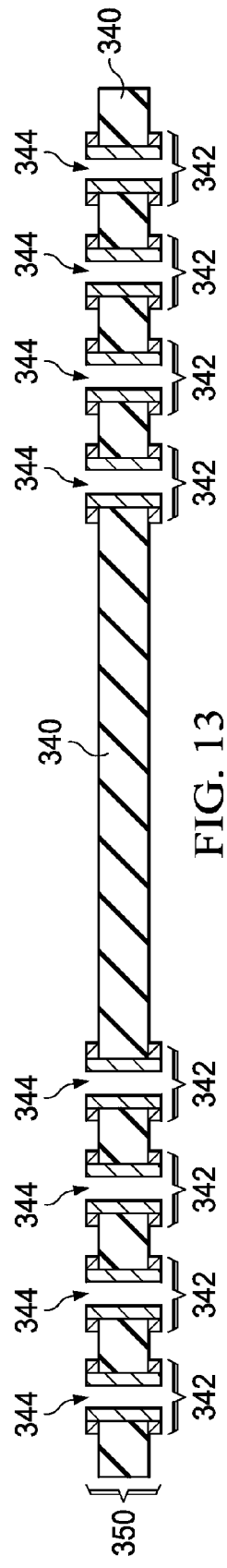

POP JOINT THROUGH INTERPOSER

BACKGROUND

In a conventional Package-on-Package (PoP) process, a top package is bonded to a bottom package. The top package and the bottom package are pre-formed before bonded to each other. The top package and the bottom package may also have device dies therein. By adopting the PoP process, the integration level of the packages may be increased.

In an existing PoP process, the formation of the bottom package includes bonding a device die to a package substrate. A molding compound is then molded on the package substrate, with the device die being molded in the molding compound. The package substrate further includes solder balls formed thereon, wherein the solder balls and the device die are on a same side of the package substrate. The solder balls are used for bonding the top package to the bottom package. Accordingly, to allow an adequate space for the device die, the heights of the solder balls need to be greater than the thickness of the device die, so that the top portions of the solder balls may protrude higher than the top surface of the device die, and higher than the top surface of the molding compound. Accordingly, the sizes of the solder balls are also large, and the number of the solder balls that can be used in a PoP structure is limited. In addition, with the large solder balls, the distance between neighboring solder balls also needs to be increased to prevent bridging.

Furthermore, the top package may also include solder regions formed thereon in order to connect to the solder balls in the bottom package. The large size of the solder balls and the additional solder from the top package makes it very difficult to prevent the bridging of solder balls while maintain the pitches of the solder balls to be small at the same time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 7 are cross-sectional views of intermediate stages in the formation of a Package-on-Package (PoP) structure in accordance with some embodiments;

FIGS. 10 through 14A are cross-sectional views and perspective views of intermediate stages in the formation of another interposer including conductive pipes in accordance with some embodiments;

DETAILED DESCRIPTION

Figure 3:
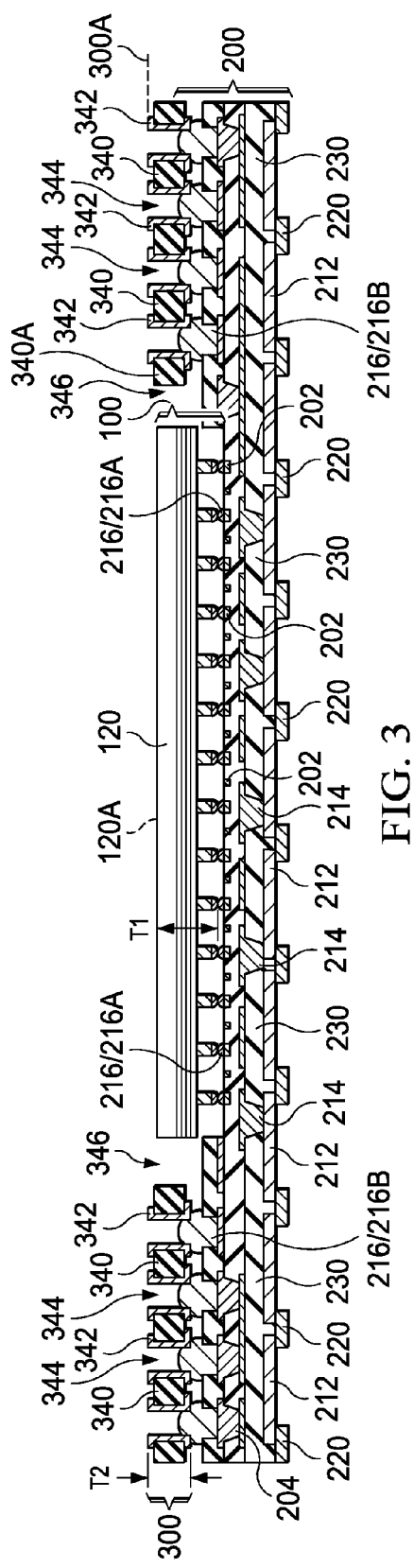

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Package-On-Package (PoP) structure and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1 through 7 are cross-sectional views of intermediate stages in the formation of a PoP structure in accordance with some exemplary embodiments. The steps shown in FIGS. 1 through 7 are also illustrated schematically in the process flow shown in FIG. 15. FIGS. 1 and 2 illustrate the cross-sectional views in the bonding of device die 100 to package component 200. Package component 200 may be a package substrate. In accordance with some embodiments of the present disclosure, package component 200 is a core-substrate including a core (not shown) and dielectric layers on opposite sides of the core, wherein redistribution lines are disposed in the dielectric layers. In alternative embodiments, package component 200 is a core-less substrate such as a laminate substrate, which includes dielectric layers laminated together and redistribution lines in the dielectric layers. FIG. 1 illustrates an exemplary core-less substrate. As shown in FIG. 1, package component 200 includes metal lines/pads 202/212 and vias 204/214 for interconnecting metal features on the top side and bottom side of package component 200. Metal lines 202/212 are also referred to as metal traces hereinafter. In accordance with some embodiments of the present disclosure, electrical connectors 216 (including 216A and 216B) and metal traces/pads 202, which are formed on the topside of package component 200, are electrically coupled to metal traces/pads 212, which are on the bottom side of package component 200. In addition, some of electrical connectors 216A may also be electrically coupled to electrical connectors 216B. In accordance with some embodiments of the present disclosure, electrical connectors 216A and 216B include solder regions, which may be formed of eutectic solder, lead-free solder, or the like. In accordance with alternative embodiments of the present disclosure, electrical connectors 216A and 216B include metal pillars, with solder caps on the metal pillars.

Metal lines 202/212 and vias 204/214 may be formed in dielectric layers 230. Dielectric layer 218, which is formed on the top side of package component 200, includes openings to expose the underlying metal pads 202. Electrical connectors 216B extend into the openings in dielectric layer 218 to electrically couple to metal pads 202. Dielectric layer 220, which is formed on the bottom side of package component 200, also includes openings to expose the overlying metal pads 212.

In the embodiments in which package component 200 includes a core (not shown), the core may include a dielectric substrate (not shown) and electrical connectors (not shown) penetrating through the dielectric substrate. In accordance with some embodiments of the present disclosure, the substrate of the core is formed of fiber glass. In alternative embodiments, the substrate of the core is formed of other dielectric materials such as epoxy, resin, glass fiber, prepreg (which comprises epoxy, resin, and/or glass fiber), resin coated Copper (RCC), glass, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), flex (polyimide), combinations thereof, and multi-layers thereof.

Device die 100 may be a logic die, a memory die, or the like, which comprises active devices such as transistors and/or diodes (not shown) therein. In some exemplary embodiments, device die 100 is a Central Processing Unit (CPU) die. In alternative embodiments, device die 100 is a mobile application die. As shown in FIG. 1, device die 100 is dispensed facing down, with electrical connectors 116 on the bottom side of device die 100 aligned to connectors 216A. In some exemplary embodiments, electrical connectors 116 are metal pads, metal pillars (metal bumps), and/or the like. In alternative embodiments, electrical connectors 116 include solder balls. Electrical connectors 116 are electrically coupled to the integrated circuit devices (not shown) inside device die 100. Device die 100 may also include semiconductor substrate 120, which has back surface 120A that faces up.

Electrical connectors 216A and 116 are then put into contact, and then a reflow is performed to melt the solder in connectors 216 and 116, so that device die 100 is bonded to package component 200. The resulting structure is shown in FIG. 2.

Referring to FIG. 3, interposer 300 is placed on package component 200. Interposer 300 includes core dielectric material 340. In some exemplary embodiments, core dielectric material 340 comprises an organic material. In alternative embodiments, core dielectric material 340 comprises an inorganic material. For example, core dielectric material 340 may include one or more material selected from epoxy, resin, glass fiber, prepreg, RCC, glass, molding compound, plastic (such as PVC, ABS, PP, PE, PS, PMMA, PET, PC, PPS, flex, combinations thereof, and multi-layers thereof). In alternative embodiments, core material 340 is a conductive or semiconductor material, which may also be formed of Cu, a metal alloy, silicon (in the form of silicon wafer), or the like. In which embodiments, however, since core material 340 is conductive or semi-conductive, insulation layers need to be formed to insulate the conductive features (such as conductive pipes 342) in interposer 300 from core material 340.

Interposer 300 further includes conductive pipes 342 penetrating through core dielectric material 340. Each of conductive pipes 342 forms a ring (viewed from the top of interposer 300) encircling one of openings 344. Conductive pipes 342 may be formed of copper, aluminum, tungsten, nickel, alloys thereof, or other conductive materials. In accordance with some embodiments of the present disclosure, openings 344 have top-view shapes of circles. In accordance with alternative embodiments, the top-view shapes of openings 344 include, and are not limited to, rectangular shapes, hexagonal shapes, octagonal shapes, or the like. Openings 344 are through-openings penetrating through interposer 300 in accordance with some embodiments.

FIG. 14A illustrates a cross-sectional view of interposer 300. As shown in FIG. 14A, conductive pipes 342 may include portions 342A inside (and coplanar with) core dielectric material 340. Conductive pipes 342 may also include upper wings 342B overlapping and contacting core dielectric material 340, and lower wings 342C underlying contacting core dielectric material 340. Upper wings 342B and lower wings 342C may also have the top-view shapes of rings, which may be circular rings in some embodiments.

Referring back to FIG. 3, when interposer 300 is placed on package component 200, conductive pipes 342 are aligned to, and are in physical contact with, electrical connectors 216B, which may include (or may be) solder regions in accordance with some embodiments of the present disclosure. Conductive pipes 342 and electrical connectors 216B may have a one to one correspondence, with each of conductive pipes 342 corresponding to one electrical connector 216B, and vice versa. The center of each of conductive pipes 342 is aligned to one of electrical connectors 216B. Since electrical connectors 216B may have round top surfaces, the top ends of electrical connectors 216B may extend into openings 344 slightly, which helps the self-alignment of conductive pipes 342 to electrical connectors 216B.

Figure 14B:
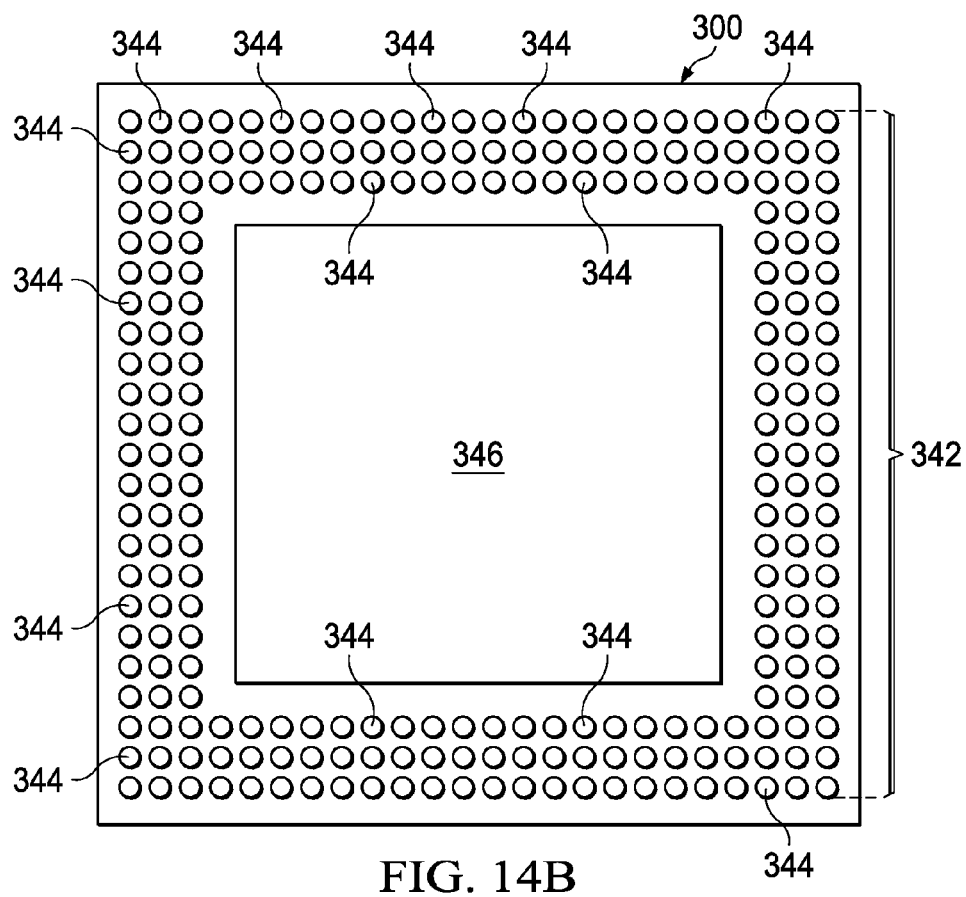
FIG. 14B illustrates a top view of the interposer including conductive pipes in accordance with some embodiments.

Interposer 300 further includes through-opening 346, which is a large opening at the center of interposer 300. Through-opening 346 may be surrounded by conductive pipes 342. FIG. 14B illustrates a top view of interposer 300 in accordance with some exemplary embodiments. As shown in FIG. 14B, through-opening 346 may have a rectangular shape, and may be located at the center of interposer 300. Conductive pipes 342 are aligned to a ring encircling through-opening 346.

Referring back to FIG. 3, through-opening 346 is large enough to accommodate device die 100 therein, wherein device die 100 extends into through-opening 346. In accordance with some embodiments of the present disclosure, core dielectric material 340 has inner edges 340A that in combination define through-opening 346. Inner edges 340A may be spaced apart from the respective edges of device die 100 in accordance with some embodiments.

After the placement of interposer 300 on package component 200, back surface 120A of device die 100 may be level with or higher than top surface 300A of interposer 300. Hence, thickness T1 of device die 100 may be greater than thickness T2 of interposer 300.

Figure 4:
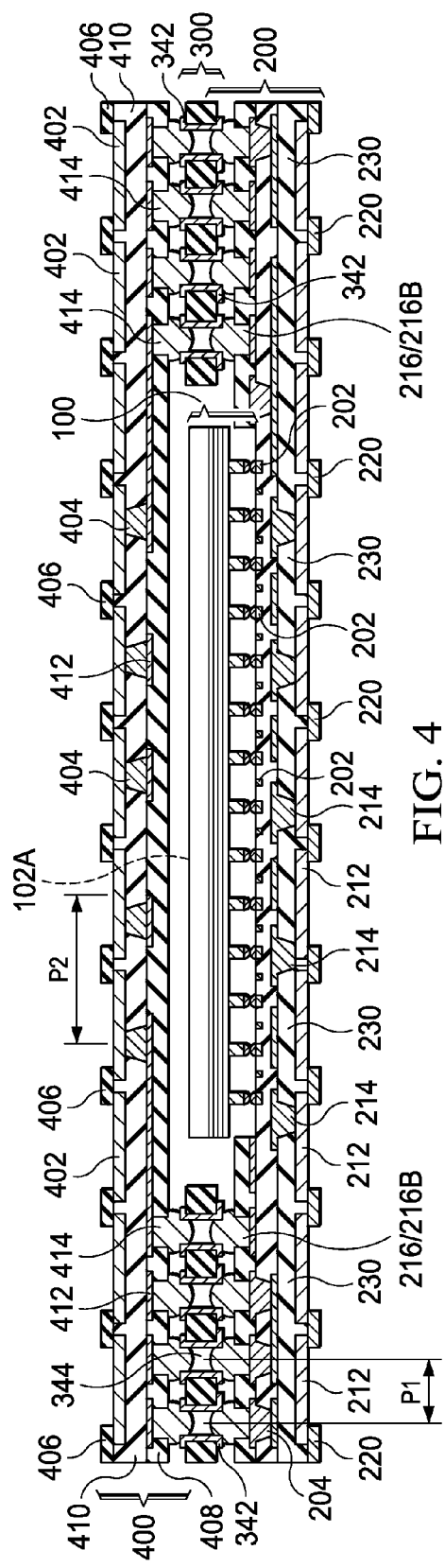

Referring to FIG. 4, interposer 400 is placed over interposer 300 and device die 100. Throughout the description, interposer 400 is alternatively referred to as a pitch-converting interposer since it has the function of converting between large pitches P2 and small pitches P1. Interposer 400 includes metal pads/traces 402 at the top, wherein metal pads 402 are exposed through the openings in top dielectric layer 406. Dielectric layer 406 may be formed of organic materials such as solder mask, polybenzoxazole (PBO), benzocyclobutene (BCB), or the like. In alternative embodiments, dielectric layer 406 is formed of inorganic dielectric materials such as silicon nitride, silicon oxide, silicon carbide, or the like. Interposer 400 further includes metal pads/traces 412 at the bottom, wherein metal pads 412 are exposed through the openings in bottom dielectric layer 408. Dielectric layer 408 may also be formed of organic materials or inorganic materials selected from the same candidate materials for forming dielectric layer 406.

Interposer 400 may further include a dielectric layer(s) 410, in which metal traces and vias 404 are formed. In accordance with some embodiments of the present disclosure, dielectric layer(s) 410 are formed of one or more material selected from epoxy, resin, glass fiber, prepreg, RCC, glass, molding compound, plastic (such as PVC, ABS, PP, PE, PS, PMMA, PET, PC, PPS, flex, combinations thereof, and multi-layers thereof).

Solder regions 414 are formed at the bottom of interposer 400, and are attached to metal pads 412 in accordance with some embodiments of the present disclosure. When interposer 400 is placed on interposer 300, solder regions 414 are aligned to, and are in physical contact with, conductive pipes 342. Conductive pipes 342 and solder regions 414 may have a one to one correspondence, with the center of each of conductive pipes 342 aligned to one of solder regions 414. Since solder regions 414 may have round bottom surfaces, the bottom ends of solder regions 414 may extend into openings 344 of interposer 300 slightly, which helps the self-alignment of interposer 400 with interposer 300.

Figure 8:
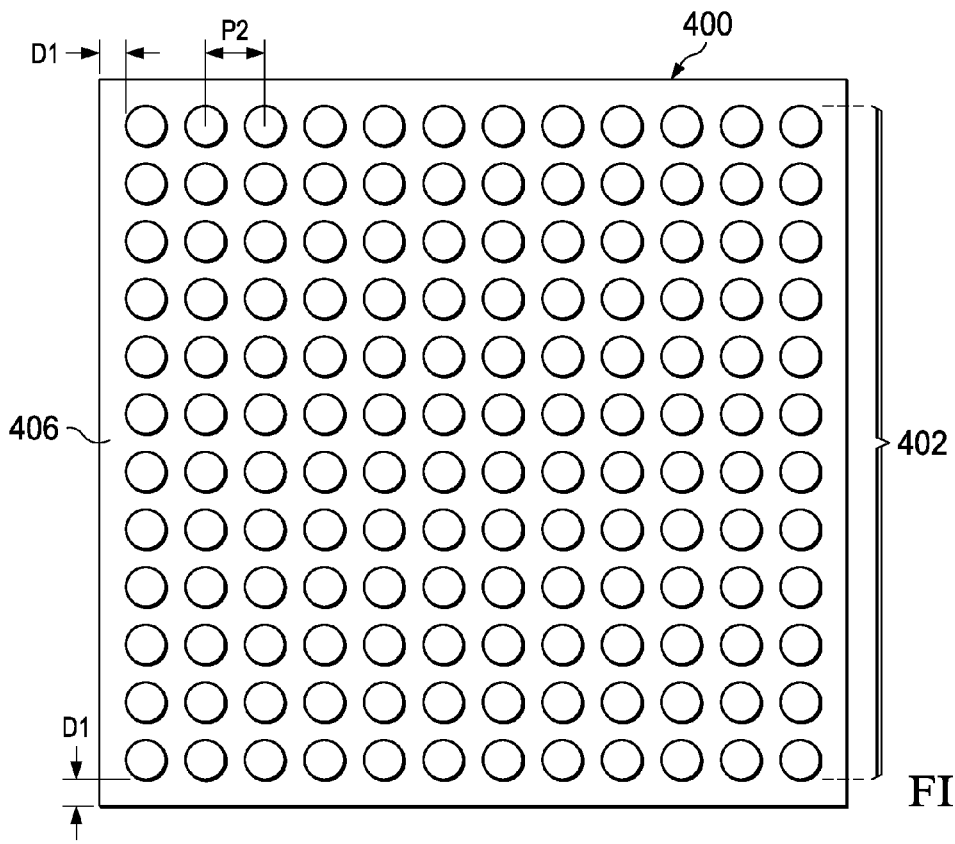
FIGS. 8 and 9 illustrate a top view and a bottom view, respectively, of an interposer in accordance with some embodiments.
Figure 9:
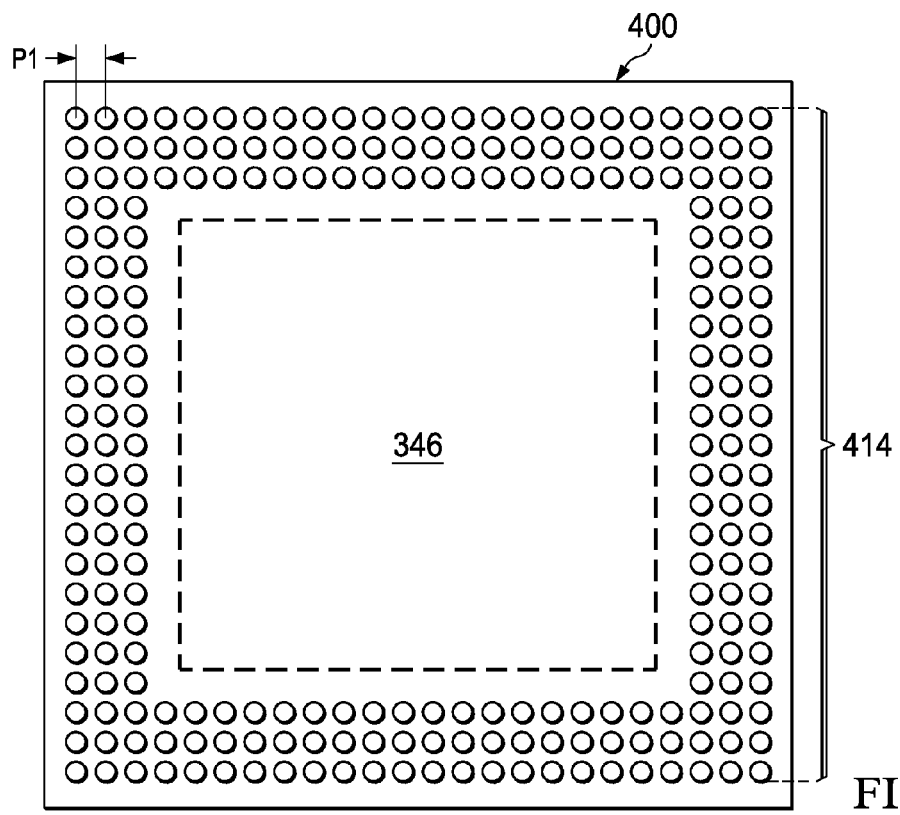

FIGS. 8 and 9 illustrate a top view and a bottom view, respectively, of interposer 400. Referring to FIG. 8, the exposed portions of metal pads 402, which are exposed through dielectric layer 406, are illustrated. The exposed metal pads 402 may be distributed throughout the entire interposer 400 including the center region and the peripheral regions. In accordance with some embodiments, the exposed metal pads 402 are distributed uniformly as an array throughout the entire interposer 400. For example, the distance D1 between the edge metal pads 402 and the respective edges of interposer 400 may be smaller than about 0.5 mm, or smaller than about 0.3 mm. The pitch P2 of metal pads 402 may be in the range from about 0.3 mm to about 0.75 mm. It is appreciated, however, that the values recited throughout the description are merely examples, and may be changed to different values.

FIG. 9 illustrates a bottom view of interposer 400, wherein solder regions 414 are illustrated. Solder regions 414 are distributed in the peripheral regions of interposer 400. However, in the center region of interposer 400, no solder region 414 is disposed. Solder regions 414 may be aligned as a ring encircling the center region, which is free from solder regions. The pitch P1 of solder regions 414 is smaller than pitch P2 (FIG. 8). In accordance with some exemplary embodiments, pitch P1 is in the range from about 0.2 mm to about 0.35 mm. In FIG. 9, through-opening 346 in interposer 300 is also illustrated.

Referring back to FIG. 4, the positions of solder regions 414 are aligned to the positions of conductive pipes 342 and electrical connectors 216B, so that each of solder regions 414 is aligned to, and is electrically connected to, one of conductive pipes 342 and one of electrical connectors 216B. In accordance with some embodiments of the present disclosure, each of solder regions 414 is electrically connected to one of metal pads 402, and vice versa. In accordance with other embodiments of the present disclosure, some of solder regions 414 may be electrically coupled to the same metal pad 402, and/or some of metal pads 402 may be electrically coupled to the same solder region 414. The electrical connections between solder regions 414 and metal pads 402 are designed in accordance with the requirements of the package.

After interposer 400 is placed on interposer 300, a reflow is performed to bond interposers 300 and 400 and package component 200 together. In accordance with some embodiments of the present disclosure, a reflow is performed after the placement of interposer 300 on package component 200, followed by an additional reflow performed after the placement of interposer 400. In alternative embodiments, after the placement of interposer 300 on package component 200, and before the placement of interposer 400, no reflow is performed. Rather, a single reflow is performed after the placement of interposer 400 to join interposer 400 to interposer 300, and interposer 300 to package component 200 at the same time.

In some exemplary embodiments, after the reflow, top surface 102A of device die 100 is spaced apart from the bottom surface of interposer 400, and there is a gap between device die 100 and interposer 400. In alternative embodiments (not shown), the top surface 102A of device die 100 contacts the bottom surface of interposer 400.

After the reflow, solder regions 414 may extend into through-openings 344 from the top. Furthermore, the solder in electrical connectors 216B may also extend into through-openings 344 from the bottom. In accordance with some embodiments of the present disclosure, solder regions 414 are spaced apart from, and are not joined with, the respective underlying electrical connectors 216B, so that air gaps are formed in through-openings 344. Throughout the description, the term "air gaps" refers to both the gaps filled with air and the gaps of vacuum. In alternative embodiments, solder regions 414 are joined with the respective underlying electrical connectors 216B. In yet other embodiments, in the same package, some solder regions 414 are not joined with the respective underlying electrical connectors 216B, while some other regions 414 are joined with the respective underlying electrical connectors 216B.

Figure 5:
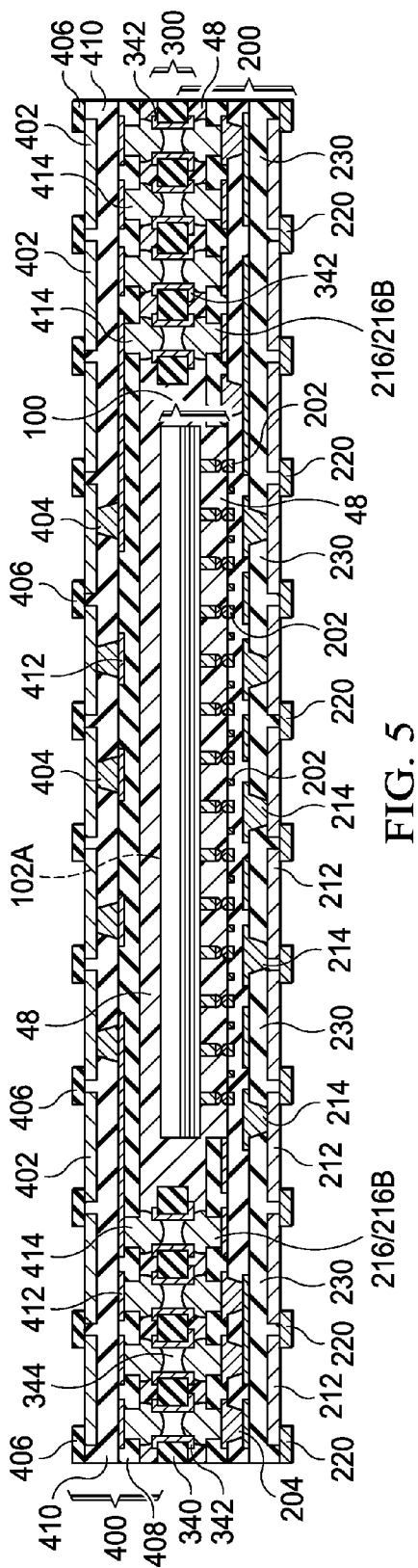

FIG. 5 illustrates the exemplary embodiments for disposing molding material 48 into the gaps formed between package component 200, device die 100, interposer 300, and interposer 400. The molding may be performed through transfer molding, for example, and other applicable molding methods may also be used. In accordance with some embodiments of the present disclosure, molding material 48 includes a molding underfill. In alternative embodiments, molding material 48 includes a molding compound, an epoxy, a resin, or the like. In some exemplary embodiments, top surface 102A of device die 100 is spaced apart from the bottom surface of interposer 400, and molding material 48 also fills the gap between device die 100 and interposer 400.

Figure 6:
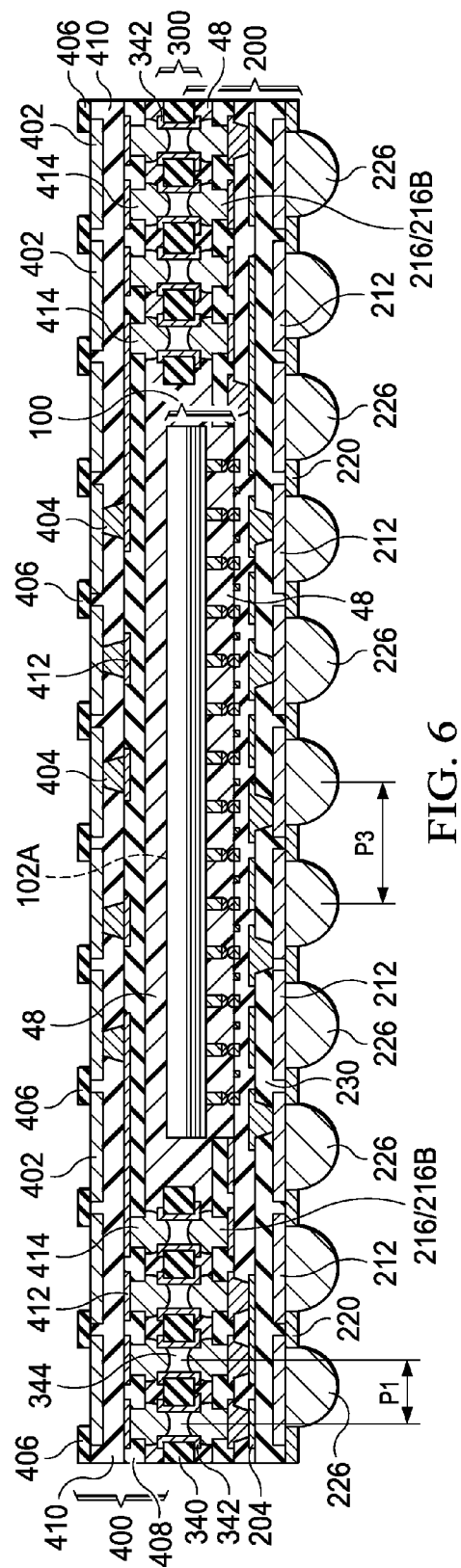

FIG. 6 illustrates a ball mount step, wherein solder regions 226 are mounted on metal pads 212. In accordance with some embodiments, pitch P3 of solder regions 226 is greater than pitch P1 of electrical connectors 216B. For example, pitch P3 may be in the range from about 0.3 mm to about 0.5 mm. Solder regions 226 may also form an array distributed uniformly throughout substantially the entire bottom surface of package component 200.

Figure 7:
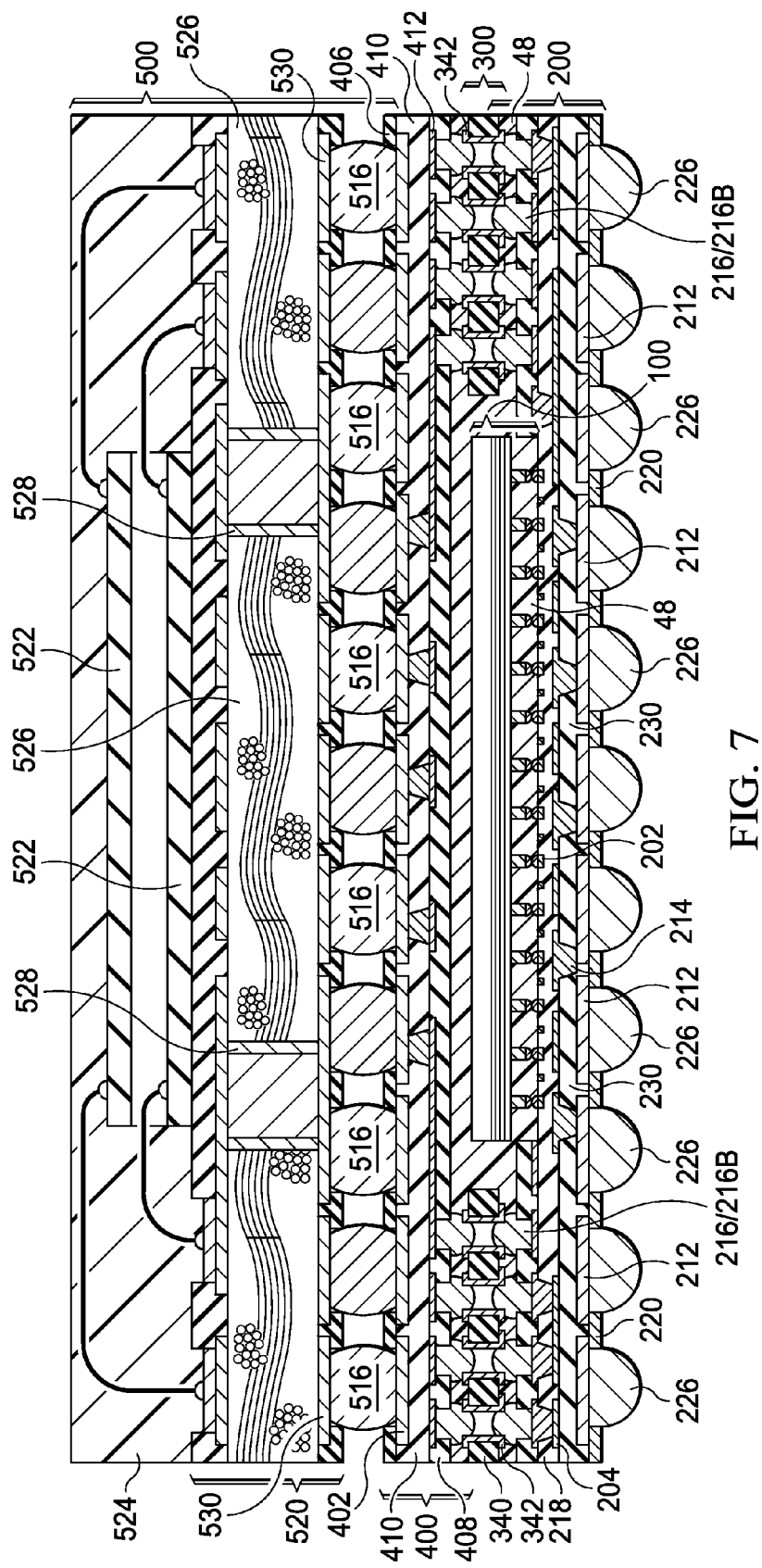

FIG. 7 illustrates the placement of top package 500 on interposer 400 and the bonding of top package 500 to interposer 400. Top package 500 may include device dies 522 and package substrate 520, wherein device dies 522 are bonded to package substrate 520. In some exemplary embodiments, device dies 522 comprise memory dies such as Static Random Access Memory (SRAM) dies, Dynamic Random Access Memory (DRAM) dies, or the like. Furthermore, molding material 524 may be pre-molded on device dies 522 and package substrate 520 before the bonding of top package 500 to interposer 400.

Package substrate 520 may include core dielectric material 526, vias 528 penetrating through core dielectric material 526, and metal pads 530 connected to vias 528. Metal pads 530 may be aligned or misaligned with the respective connecting vias 528. Solder balls 516 are mounted on metal pads 530, and are aligned to metal pads 402 of interposer 400.

Referring again to FIG. 7, a reflow is performed to bond top package 500 to interposer 400. Solder regions 516 are thus joined to metal pads 402 in interposer 400. In the resulting structure, top package 500 is electrically coupled to package component 200 and device die 100 through interposers 300 and 400. The PoP structure is thus formed.

Figure 10:
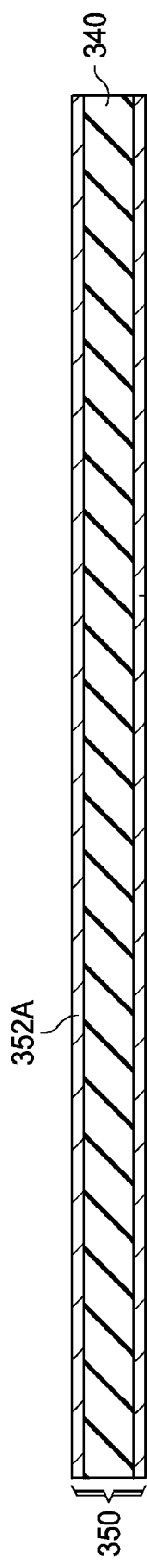

FIGS. 10 through 14A illustrate the cross-sectional views in the formation of interposer 300 in accordance with some embodiments. Referring to FIG. 10, sandwich board 350 is provided. Sandwich board 350 includes core dielectric layer 340 and conductive films 352A and 352B attached to the opposite sides of core dielectric layer 340. Core dielectric layer 340 may be formed of an organic or inorganic dielectric material, as discussed in preceding paragraphs. Conductive films 352A and 352B may comprise copper, aluminum, tungsten, nickel, gold, alloys thereof, and/or multi-layers thereof.

Figure 11:
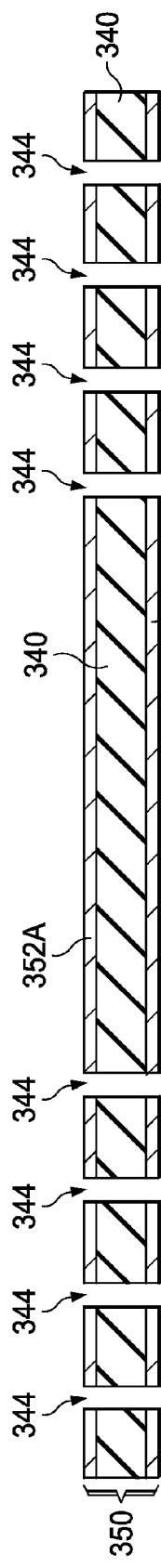
Figure 12:
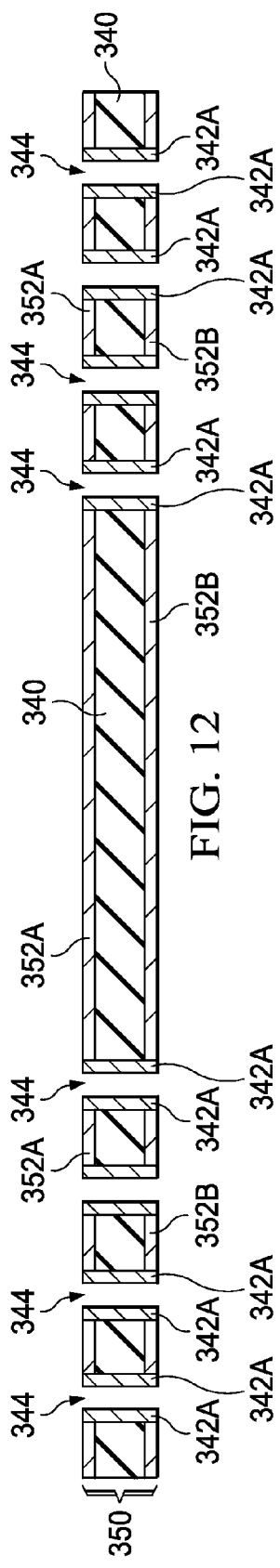

Next, as shown in FIG. 11, through-openings 344 are formed to penetrate through sandwich board 350. The formation of through-openings 344 may include mechanical drilling, laser drilling, or the like. Through-openings 344 are distributed to the peripheral regions of sandwich board 350, with no through-openings 344 formed in the center region of sandwich board 350. FIG. 12 illustrates the formation of conductive pipes 342 inside through-openings 344, which may be performed through plating. The plated conductive material may also include copper, aluminum, tungsten, nickel, gold, or alloys thereof, which, besides being plated inside through-openings 344, is also plated on the top surface of conductive film 352A and the bottom surface of conductive film 352B.

FIG. 13 illustrates the patterning of conductive films 352A and 352B, which may be performed through a photo lithography process. As a result the patterning, the remaining portions of conductive films 352A and 352B and the plated material form conductive pipes 342. Next, in FIG. 14A, the center portion of core dielectric layer 340 is removed, forming through opening 346. The formation of interposer 300 is thus finished. The resulting interposer 300 may then be placed on package component 200, as illustrated in FIG. 3. FIG. 14B illustrates the top view of the resulting interposer 300, in which conductive pipes 342 and through-openings 344 and 346 are illustrated.

Figure 15:
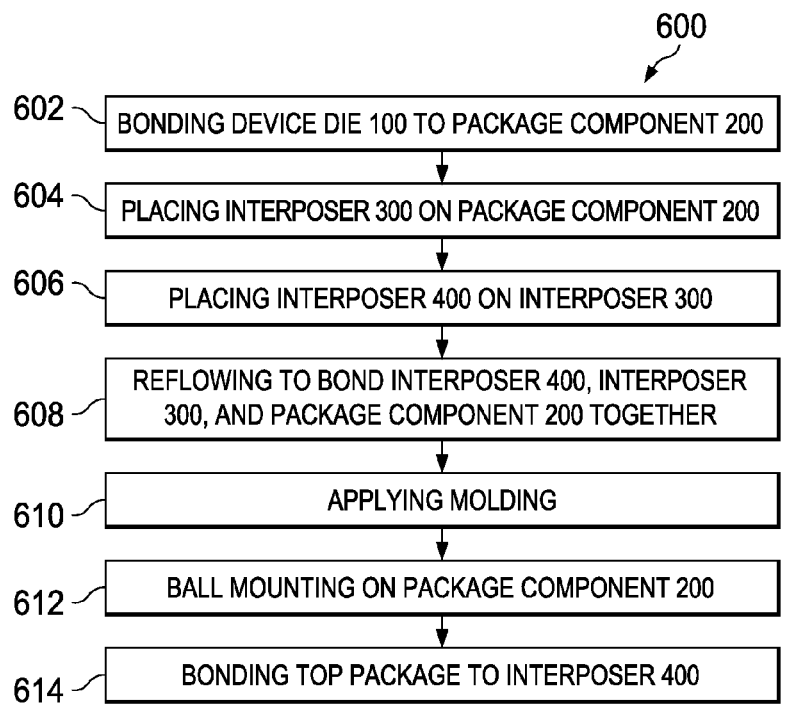
FIG. 15 illustrates a process flow for forming a PoP structure in accordance with some embodiments.

FIG. 15 schematically illustrates the process flow 600 illustrating the processes shown in FIGS. 1 through 7. The process flow is briefly discussed herein. The details of the process flow may be found in the discussion of FIGS. 1 through 7. In step 602, device die 100 is bonded to package component 200, as shown in FIGS. 1 and 2. In step 604 of the process flow in FIG. 15, interposer 300 is placed over package component 200, and the respective process is illustrated in FIG. 3. In steps 606 and 608 of the process flow in FIG. 15, interposer 400 is placed over interposer 300, followed by a reflow to join interposers 400 and 300 and package component 200 together, and the respective process is illustrated in FIG. 4. In step 610 of the process flow in FIG. 15, molding compound 48 is disposed, and the respective process is illustrated in FIG. 5. In step 612 of the process flow in FIG. 15, a ball mount step is performed, with solder regions 226 mounted on package component 200, and the respective process is illustrated in FIG. 6. In step 612 of the process flow in FIG. 15, top package 500 is bonded to interposer 400, and the respective process is illustrated in FIG. 7.

The embodiments of the present disclosure have some advantageous features. Molding compound typically has very high Coefficient of Thermal Expansion (CTE) mismatch with the overlying top package and the underlying package substrate. In conventional PoP structures, the molding compound has a large volume since it has to fill the space between the top package and the package component, which space is enlarged due to the existence of the device die. This results in a severe warpage in the resulting PoP structure. In the embodiments of the present disclosure, interposer 300 (FIG. 7) occupies some of the space that otherwise will be occupied by the molding compound. Since the CTE mismatch between interposer 300 and the overlying and the underlying structure is low, the warpage of the resulting PoP structure is reduced. In addition, in conventional PoP packages, the volume of the solder for connecting package substrate to the top package is large due to the large standoff distance between the package substrate to the top package. In accordance with the embodiments of the present disclosure, the conductive pipes of the interposer results in a significant reduction in the volume of solder, and the risk of solder bridging is reduced.

In accordance with some embodiments of the present disclosure, a package includes a package component and an interposer over and bonded to the package component. The package component includes a solder region. The interposer includes a core dielectric material, a conductive pipe penetrating through the core dielectric material, with the first solder region in contact with a bottom end of the conductive pipe, and a through-opening in a center region of the interposer.

In accordance with alternative embodiments of the present disclosure, a package includes a first interposer and a second interposer over the first interposer. The first interposer includes a core dielectric material, a through-opening in a center region of the first interposer, and a plurality of conductive pipes penetrating through the core dielectric material. The plurality of conductive pipes encircles the through-opening. The second interposer includes a first plurality of solder regions on a bottom side of the second interposer, each bonded to one of the plurality of conductive pipes, wherein no solder region is disposed on the bottom side of the second interposer and overlapping the through-opening of the first interposer. The second interposer further includes a second plurality of solder regions on a top side of the second interposer.

In accordance with yet alternative embodiments of the present disclosure, a method includes bonding a device die onto a top surface of a package component, and placing an interposer over the package component. A plurality of conductive pipes of the interposer is placed over and in contact with a plurality of solder regions of the package component. The device die extends into a through-opening in the interposer. A reflow is performed to bond the interposer to the package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a package component comprising a first solder region; and
   a first interposer over and bonded to the package component, wherein the first interposer comprises:
   a core dielectric material;

a conductive pipe penetrating through the core dielectric material, wherein the first solder region is in contact with a bottom end of the conductive pipe; and a through-opening in a center region of the first interposer.

2. The package of claim 1 further comprising a device die bonded to the package component, wherein the device die extends into the through-opening of the first interposer.

3. The package of claim 1 further comprising a second solder region in contact with a top end of the conductive pipe.

4. The package of claim 3, wherein the first solder region and the second solder region are spaced apart from each other, with an unoccupied gap between the first solder region and the second solder region.

5. The package of claim 1, wherein the first solder region extends into the conductive pipe.

6. The package of claim 1 further comprising a second interposer over the first interposer, wherein the second interposer comprises:

a plurality of metal pads distributed substantially uniformly throughout a top surface of the second interposer; and a plurality of solder regions distributed in peripheral regions of a bottom surface of the second interposer, wherein no solder region is distributed to a center region of the bottom surface of the second interposer, and the plurality of solder regions is electrically coupled to the plurality of metal pads.

7. The package of claim 1, wherein the conductive pipe further comprises a wing contacting an upper surface or a bottom surface of the core dielectric material.

8. A package comprising:
a first interposer comprising:
a core dielectric material;
a through-opening in a center region of the first interposer;
a plurality of conductive pipes penetrating through the core dielectric material, wherein the plurality of conductive pipes encircles the through-opening; and
a second interposer over the first interposer, the second interposer comprising:
a first plurality of solder regions on a bottom side of the second interposer, each bonded to one of the plurality of conductive pipes; and
a second plurality of solder regions on a top side of the second interposer.

9. The package of claim 8 further comprising a package over and bonded to the second plurality of solder regions.

10. The package of claim 8 further comprising a device die extending into the through-opening of the first interposer.

11. The package of claim 8 further comprising a package substrate underlying the first interposer, wherein the package substrate comprises a third plurality of solder regions, each bonded to one of the plurality of conductive pipes.

12. The package of claim 11, wherein the first plurality of solder regions and the third plurality of solder regions extend into the plurality of conductive pipes, and the first plurality of solder regions is spaced apart from respective ones of the third plurality of solder regions by gaps.

13. The package of claim 8, wherein the first plurality of solder regions extends into a plurality of through-openings in the first interposer, with each of the plurality of through-openings encircled by one of the plurality of conductive pipes.

14. The package of claim 8, wherein the second plurality of solder regions is distributed substantially uniformly throughout the top side of the second interposer.

15. A package comprising:
a first interposer comprising:
a plurality of conductive pipes; and
an opening encircled by the plurality of conductive pipes;
a first plurality of solder regions extending into spaces in the plurality of conductive pipes, wherein the first plurality of solder regions comprises portions over the first interposer;
a second plurality of solder regions extending into the spaces in the plurality of conductive pipes, wherein the second plurality of solder regions comprises portions underlying the first interposer; and
a device die extending into the opening of the first interposer.

16. The package of claim 15, wherein a first one of the first plurality of solder regions and a second one of the second plurality of solder regions extend into a same one of the plurality of conductive pipes, and are spaced apart from each other by an air gap.

17. The package of claim 15, wherein the opening of the first interposer is a through-opening.

18. The package of claim 15 further comprising a second interposer overlapping the first interposer and the device die, wherein the second interposer comprises:
first conductive features bonded to the second plurality of solder regions and having a first pitch; and
second conductive features on an opposite side of the second interposer, wherein the second conductive features have a second pitch greater than the first pitch.

19. The package of claim 15 further comprising a package substrate, with the first plurality of solder regions and the device die both bonded to the package substrate.

20. The package of claim 15 further comprising an underfill filling the opening of the first interposer and gaps between the second plurality of solder regions.

* * * * *